United States Patent
Wan

(10) Patent No.: US 7,948,317 B2
(45) Date of Patent: May 24, 2011

(54) POWER AMPLIFIER INTEGRATED CIRCUIT WITH COMPENSATION MECHANISM FOR TEMPERATURE AND OUTPUT POWER

(75) Inventor: Kuang-Lieh Wan, Taipei County (TW)

(73) Assignee: RichWave Technology Corp., Taipei (TW)

( * ) Notice: Subject to any disclaimer, the term of this patent is extended or adjusted under 35 U.S.C. 154(b) by 0 days.

(21) Appl. No.: 12/619,684

(22) Filed: Nov. 17, 2009

(65) Prior Publication Data

US 2010/0301945 A1 Dec. 2, 2010

(30) Foreign Application Priority Data

Jun. 2, 2009 (TW) .............................. 98118173 A

(51) Int. Cl.
*H03F 3/21* (2006.01)

(52) U.S. Cl. ........................................ 330/277; 330/289

(58) Field of Classification Search .................. 330/277, 330/289, 256, 266, 272, 310

See application file for complete search history.

(56) References Cited

U.S. PATENT DOCUMENTS

| 6,114,910 A * | 9/2000 | Goff .............................. 330/289 |
| 6,677,823 B2 * | 1/2004 | Terosky et al. ............... 330/289 |

* cited by examiner

*Primary Examiner* — Hieu P Nguyen
(74) *Attorney, Agent, or Firm* — Winston Hsu; Scott Margo

(57) ABSTRACT

A power amplifier integrated circuit, which generates an RF output signal by amplifying an RF input signal, includes a thermal-sensing circuit, a feedback circuit, a logic judging circuit, an adjusting circuit, and an amplifying circuit. The thermal-sensing circuit generates a thermal sensing signal according to the operational temperature, and the feedback circuit generates a power compensation circuit according to power variations in the RF output signal. The logic judging circuit outputs a compensation signal according to the thermal sensing signal and the power compensation signal. The adjusting circuit adjusts the level of the RF input signal according to the compensation signal, thereby generating a corresponding 1st stage RF signal. The amplifying circuit can amplify the 1st stage RF signal, thereby generating the corresponding RF output signal.

24 Claims, 10 Drawing Sheets

POWER AMPLIFIER INTEGRATED CIRCUIT WITH COMPENSATION MECHANISM FOR TEMPERATURE AND OUTPUT POWER

BACKGROUND OF THE INVENTION

1. Field of the Invention

The present invention is related to a power amplifier integrated circuit, and more particularly, to a power amplifier integrated circuit with compensation mechanism for temperature and output power.

2. Description of the Prior Art

In recent years, power amplifier integrated circuits (PAICs) have been widely used in various wired or wireless communication devices. Reference is made to FIG. 1 for a functional diagram illustrating a prior art PAIC 100. The PAIC 100 includes a plurality of connecting ports 101a-101c, n stage amplifying units OP1-OPn, and a bias circuit 110. The input port 101a is for receiving a radio frequency (RF) input signal RFin, the output port 101b is for providing an RF output signal RFout, and the supply voltage input port 101c is for receiving a bias voltage Vc. The bias circuit 110 includes n current sources for providing constant operational currents IS1-ISn to the n stage amplifying units OP1-OPn, respectively. Each of the n stage amplifying units OP1-OPn includes a bipolar junction transistor (BJT) having a collector coupled to the supply voltage input port 101c for receiving the bias voltage Vc and a base coupled to the bias circuit 110 for respectively receiving the operational currents IS1-ISn. The signal gains provided by the amplifying units OP1-OPn are represented by $g_{m1}*g_{m2}* \ldots *g_{mn}$, respectively. Therefore, the overall signal gain of the PAIC 100 can be represented by a or RFout=$(g_{m1}*g_{m2}* \ldots *g_{mn})$ RFin. Since the characteristics of BJTs are temperature-sensitive, the signal gains $g_{m1}$-$g_{mn}$ may vary due to temperature fluctuations, and the RF output signal RFout may not be able to remain constant. On the other hand, when the RF output signal RFout fluctuates due to some reason, the prior art PAIC 100 is unable to provide compensation.

Reference is made to FIG. 2 for a functional diagram illustrating another prior art PAIC 200. The PAIC 200 includes a plurality of connecting ports 201a-201c, n stage amplifying units OP1-OPn, a bias circuit 210, a thermal-sensing circuit 220, and a feedback circuit 230. The input port 201a is for receiving an RF input signal RFin, the output port 201b is for providing an RF output signal RFout, and the supply voltage input port 201c is for receiving a bias voltage Vc. The thermal-sensing circuit 220 can detect variations in the operational temperature, thereby generating a corresponding thermal sensing signal St. The feedback circuit 230 can detect power variations of the RF output signal RFout, thereby generating a corresponding power compensation signal Sp. The bias circuit 210 includes n current sources for respectively providing operational currents IS1-ISn to n stage amplifying units OP1-OPn according to the thermal sensing signal St and the power compensation signal Sp. Each of the n stage amplifying units OP1-OPn includes a BJT having a collector coupled to the supply voltage input port 201c for receiving the bias voltage Vc and a base coupled to the bias circuit 210 for respectively receiving the operational currents IS1-ISn. The signal gains provided by the amplifying units OP1-OPn are represented by $g_{m1}$-$g_{mn}$, respectively. In the prior art PAIC 200, the variations in the operational temperature can be detected by the thermal-sensing circuit 220 and the variations in the RF output signal RFout can be detected by the feedback circuit 230. By adjusting the operational currents IS1-ISn accordingly, the signal gains $g_{m1}$-$g_{mn}$ of the amplifying units OP1-OPn can thus be adjusted so as to compensate temperature or power fluctuations. However, the signal gains $g_{m1}$-$g_{mn}$ can only be slightly modified by changing the operational currents IS1-ISn. The output power of the RF output signal RFout provided by the prior art PAIC 200 cannot be effectively stabilized.

Reference is made to FIG. 3 for a functional diagram illustrating another prior art PAIC 300. The PAIC 300 includes a plurality of connecting ports 301a-301c, n stage amplifying units OP1-OPn, a bias circuit 310, a thermal-sensing circuit 320, a feedback circuit 330, and a regulator 340. The input port 301a is for receiving an RF input signal RFin, the output port 301b is for providing an RF output signal RFout, and the supply voltage input port 301c is for receiving the RF output signal RFout. The thermal-sensing circuit 320 can detect variations in the operational temperature, thereby generating a corresponding thermal sensing signal St. The feedback circuit 330 can detect power variations in the RF output signal RFout, thereby generating a corresponding power compensation signal Sp. The bias circuit 310 includes n current sources for respectively providing constant operational currents IS1-ISn to n stage amplifying units OP1-OPn. The regulator 340 can generate a bias voltage Vc according to the thermal sensing signal St and the power compensation signal Sp. Each of the n stage amplifying units OP1-OPn includes a BJT having a collector coupled to the regulator 340 for receiving the bias voltage Vc and a base coupled to the bias circuit 310 for respectively receiving the operational currents IS1-ISn. The signal gains provided by the amplifying units OP1-OPn are represented by $g_{m1}$-$g_{mn}$, respectively. In the prior art PAIC 300, the variations in the operational temperature can be detected by the thermal-sensing circuit 320 and the variations in the RF output signal RFout can be detected by the feedback circuit 330. By adjusting the bias voltage Vc accordingly, the signal gains $g_{m1}$-$g_{mn}$ of the amplifying units OP1-OPn can thus be adjusted so as to compensate temperature or power fluctuations. However, the signal gains $g_{m1}$-$g_{mn}$ can only be slightly modified by changing the bias voltage Vc. The output power of the RF output signal RFout provided by the prior art PAIC 300 cannot be effectively stabilized.

SUMMARY OF THE INVENTION

The present invention provides a power amplifier integrated circuit with compensation mechanism for temperature, comprising an input port for receiving an RF input signal; an output port for providing an RF output signal, the RF output signal being an amplified version of the RF input signal; a thermal compensation circuit coupled to the input port for receiving the RF input signal, for adjusting the RF input signal according to a temperature, and for outputting the adjusted RF input signal; and an amplifying circuit coupled to the thermal compensation circuit for receiving and amplifying the adjusted RF input signal.

The present invention further provides a power amplifier integrated circuit with compensation mechanism for power, comprising an input port for receiving an RF input signal; an output port for outputting an RF output signal, the RF output signal being an amplified version of the RF input signal; a feedback circuit for detecting voltage variations in the RF output signal, thereby generating a corresponding power compensation signal; an adjusting circuit for adjusting a level of the RF input signal according to the power compensation signal, thereby generating a corresponding 1st stage RF signal; and an amplifying circuit for generating the RF output signal by amplifying the 1st stage RF signal.

The present invention further provides a power amplifier integrated circuit with compensation mechanism for temperature and power comprising an input port for receiving an RF input signal; an output port for outputting an RF output signal, the RF output signal being an amplified version of the RF input signal; a thermal-sensing circuit for generating a thermal sensing signal according to an operational temperature; a feedback circuit for detecting voltage variations in the RF output signal, thereby generating a corresponding power compensation signal; a logic judging circuit for outputting a compensation signal according to the thermal sensing signal and the power compensation signal; an adjusting circuit for adjusting a level of the RF input signal according to the compensation signal, thereby generating a corresponding 1st stage RF signal; and an amplifying circuit for generating the RF output signal by amplifying the 1st stage RF signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
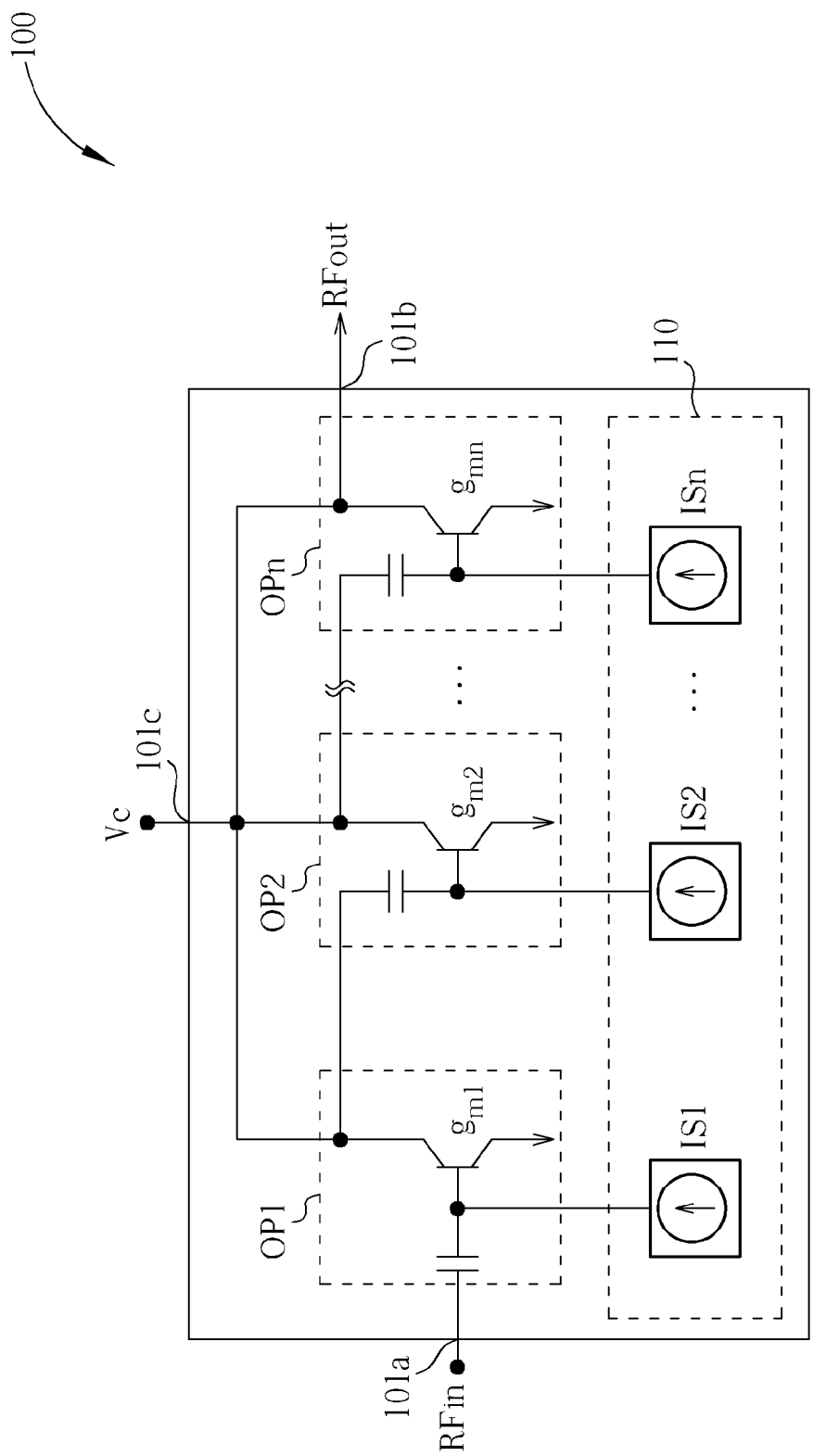
FIG. 1 is a functional diagram illustrating a prior art power amplifier integrated circuit.
Figure 2:
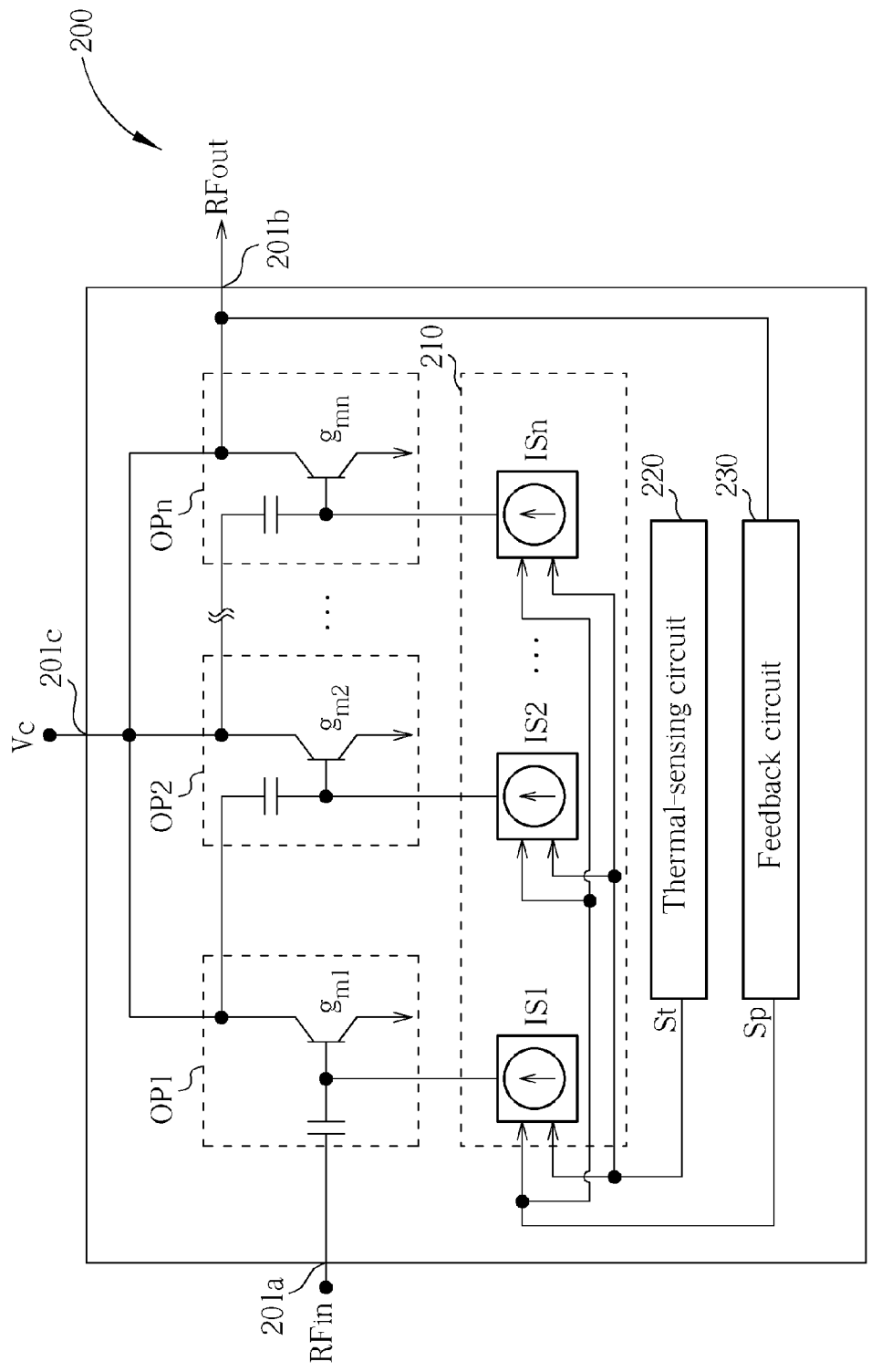
FIG. 2 is a functional diagram illustrating another prior art power amplifier integrated circuit.
Figure 3:
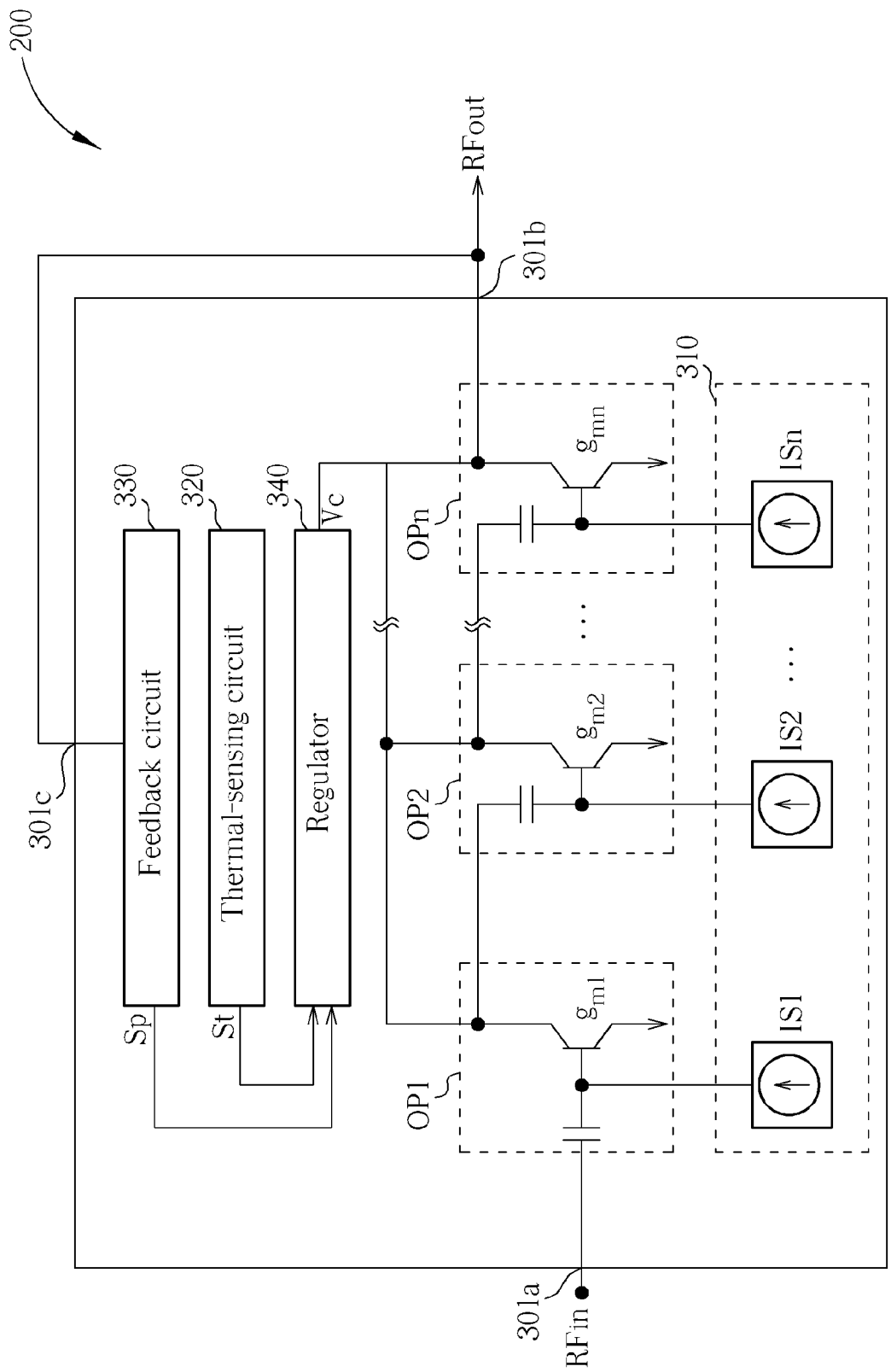
FIG. 3 is a functional diagram illustrating another prior art power amplifier integrated circuit.
Figure 4:
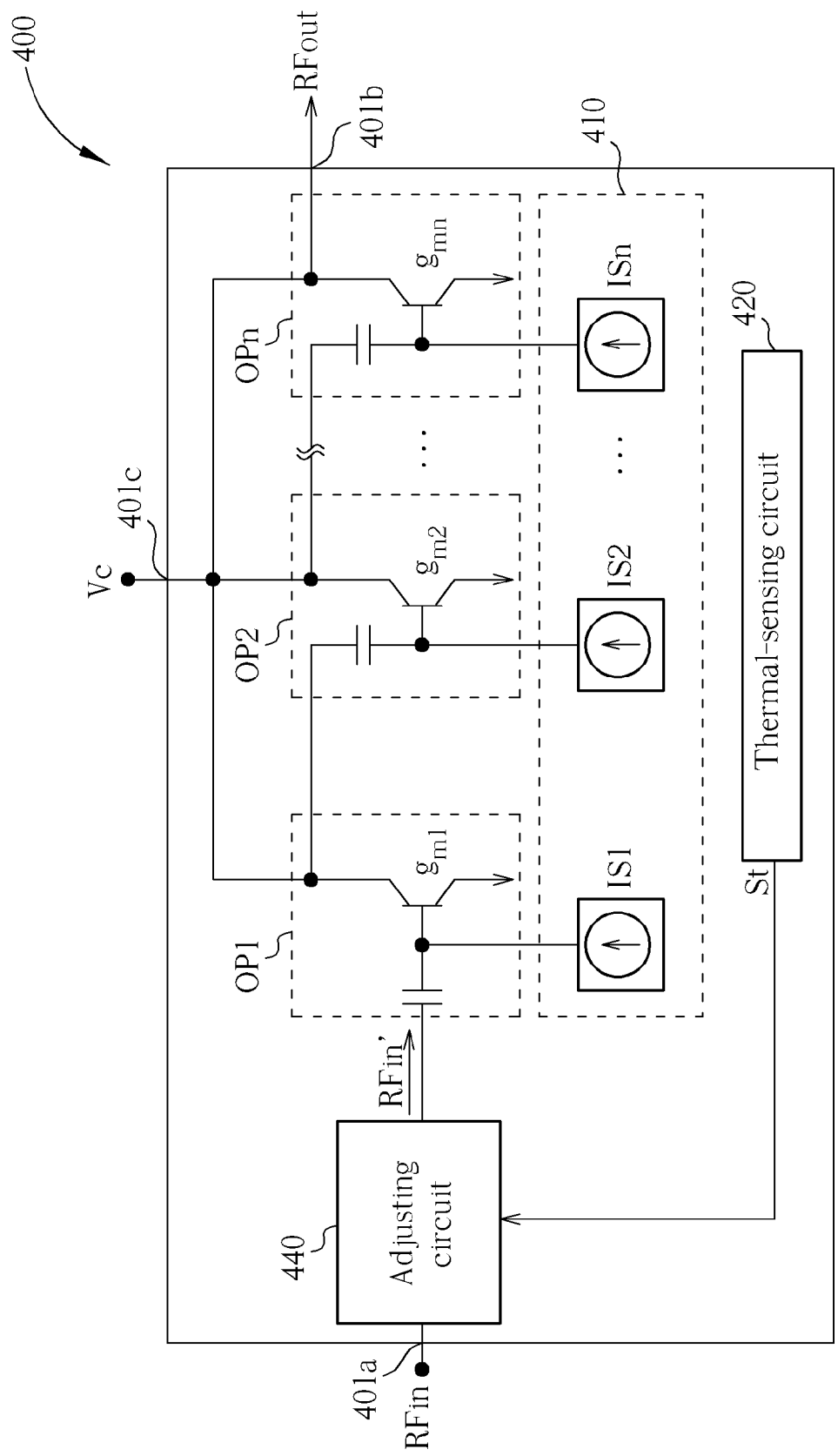
FIG. 4 is a functional diagram illustrating a power amplifier integrated circuit according to a first embodiment of the present invention.

Reference is made to FIG. 4 for a functional diagram illustrating a PAIC 400 according to a first embodiment of the present invention. The PAIC 400 includes a plurality of connecting ports 401a-401c, n stage amplifying units OP1-OPn, a bias circuit 410, a thermal-sensing circuit 420, and an adjusting circuit 440. The input port 401a is for receiving an RF input signal RFin, the output port 401b is for providing an RF output signal RFout, and the supply voltage input port 401c is for receiving a constant bias voltage Vc. The bias circuit 410 includes n current sources for providing constant operational currents IS1-ISn to the n stage amplifying units OP1-OPn, respectively. The thermal-sensing circuit 420 and the adjusting circuit 440 together form a thermal compensation circuit. The thermal-sensing circuit 420 can detect variations in the operational temperature, thereby generating a corresponding thermal sensing signal St. The adjusting circuit 440 is coupled to the input port 401a for receiving the RF input signal RFin, adjusting the RF input signal RFin according to the thermal sensing signal St, and outputting a corresponding RF input signal RFin'. Each of the n stage amplifying units OP1-OPn includes a BJT: the base of the BJT in the amplifying unit OP1 is coupled to the input port 401a via a capacitor, and the base of each BJT in the amplifying units OP2-OPn is coupled to the collector of the BJT in the corresponding prior-stage amplifying unit via a capacitor. The signal gains provided by the amplifying units OP1-OPn are represented by $g_{m1}$-$g_{mn}$, respectively. In the PAIC 400 of the present invention, the variations in the operational temperature can be detected by the thermal-sensing circuit 420. The RF input signal RFin can thus be adjusted for compensating temperature fluctuations without changing the signal gains $g_{m1}$-$g_{mn}$ of the amplifying units OP1-OPn. As a result, the output power of the RF output signal RFout provided by the PAIC 400, which is equal to $(g_{m1}*g_{m2}* \ldots *g_{mn})$ RFin', can be effectively stabilized.

Figure 5:
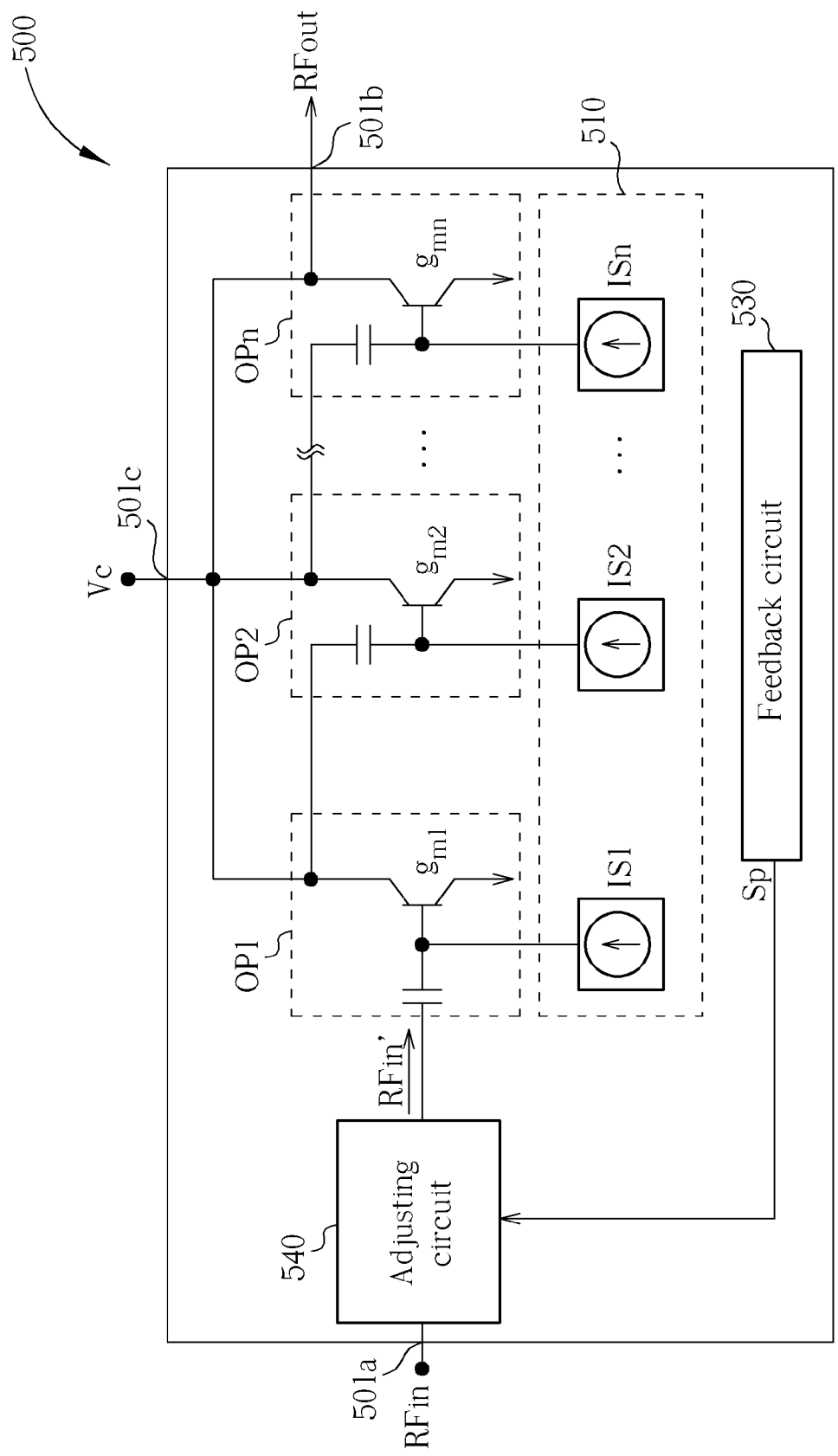
FIG. 5 is a functional diagram illustrating a power amplifier integrated circuit according to a second embodiment of the present invention.

Reference is made to FIG. 5 for a functional diagram illustrating a PAIC 500 according to a second embodiment of the present invention. The PAIC 500 includes a plurality of connecting ports 501a-501c, n stage amplifying units OP1-OPn, a bias circuit 510, a feedback circuit 530, and an adjusting circuit 540. The input port 501a is for receiving an RF input signal RFin, the output port 501b is for providing an RF output signal RFout, and the supply voltage input port 501c is for receiving a constant bias voltage Vc. The bias circuit 510 includes n current sources for providing constant operational currents IS1-ISn to the n stage amplifying units OP1-OPn, respectively. The feedback circuit 530 can detect power variations in the RF output signal RFout, thereby generating a corresponding power compensation signal Sp. The adjusting circuit 540 is coupled to the input port 501a for receiving the RF input signal RFin, adjusting the RF input signal RFin according to the power compensation signal Sp, and outputting a corresponding RF input signal RFin'. Each of the n stage amplifying units OP1-OPn includes a BJT having a collector coupled to the bias circuit 510 for respectively receiving the constant operational currents IS1-ISn. The base of the BJT in the amplifying unit OP1 is coupled to the input port 501a via a capacitor, and the base of each BJT in the amplifying units OP2-OPn is coupled to the collector of the BJT in the corresponding prior-stage amplifying unit via a capacitor. The signal gains provided by the amplifying units OP1-OPn are represented by $g_{m1}$-$g_{mn}$, respectively. In the PAIC 500 of the present invention, the power variations in the RF output signal RFout can be detected by the feedback circuit 530. The RF input signal RFin can thus be adjusted for compensating power fluctuations without changing the signal gains $g_{m1}$-$g_{mn}$ of the amplifying units OP1-OPn. As a result, the output power of the RF output signal RFout provided by the PAIC 500, which is equal to $(g_{m1}*g_{m2}* \ldots *g_{mn})$ RFin', can be effectively stabilized.

Figure 6:
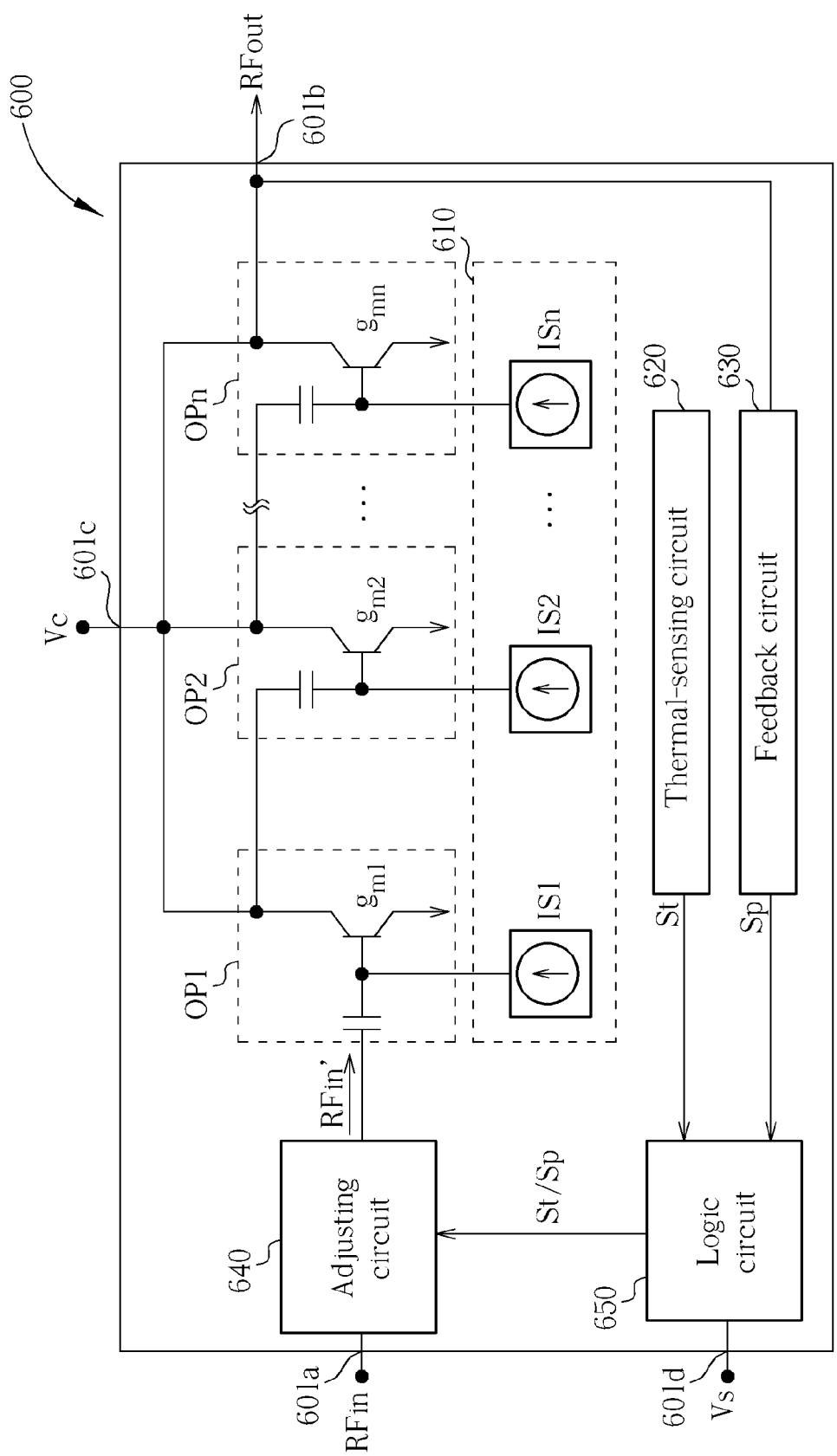
FIG. 6 is a functional diagram illustrating a power amplifier integrated circuit according to a third embodiment of the present invention.

Reference is made to FIG. 6 for a functional diagram illustrating a PAIC 600 according to a third embodiment of the present invention. The PAIC 600 includes a plurality of connecting ports 601a-601d, n stage amplifying units OP1-OPn, a bias circuit 610, a thermal-sensing circuit 620, a feedback circuit 630, an adjusting circuit 640, and a logic circuit 650. The input port 601a is for receiving an RF input signal RFin, the output port 601b is for providing an RF output signal RFout, the supply voltage input port 601c is for receiving a constant bias voltage Vc, and the control port 601d is for receiving a control signal Vs. The bias circuit 610 includes n current sources for providing constant operational currents IS1-ISn to the n stage amplifying units OP1-OPn, respectively. The thermal-sensing circuit 620 can detect variations in the operational temperature, thereby generating a corresponding thermal sensing signal St. The feedback circuit 630 can detect power variations in the RF output signal RFout, thereby generating a corresponding power compensation signal Sp. The logic circuit 650 can receive the control signal Vs from the control port 601d, the thermal sensing signal St from the thermal-sensing circuit 620 and the power compensation signal Sp from the feedback circuit 630. According to the control signal Vs, the logic circuit 650 outputs the thermal sensing signal St or the power compensation signal Sp to the adjusting circuit 640. The adjusting circuit 640 is coupled to the input port 601a for receiving the RF input signal RFin, adjusting the RF input signal RFin according to the thermal sensing signal St or the power compensation signal Sp, and outputting a corresponding RF input signal RFin'. Each of the n stage amplifying units OP1-OPn includes a BJT having a collector coupled to the voltage input port 601c for receiving the bias voltage Vc and a base coupled to the bias circuit 610 for respectively receiving the operational currents IS1-ISn. The base of the BJT in the amplifying unit OP1 is coupled to the input port 601a via a capacitor, and the base of each BJT in the amplifying units OP2-OPn is coupled to the collector of the BJT in the corresponding prior-stage amplifying unit via a capacitor. The signal gains provided by the amplifying units OP1-OPn are represented by $g_{m1}$-$g_{mn}$, respectively. In the PAIC 600 of the present invention, the variations in the operational temperature can be detected by the thermal-sensing circuit 620, and the power variations in the RF output signal RFout can be detected by the feedback circuit 630. The RF input signal RFin can thus be adjusted for compensating temperature or power fluctuations without changing the signal gains $g_{m1}$-$g_{mn}$ of the amplifying units OP1-OPn. As a result, the output power of the RF output signal RFout provided by the PAIC 600, which is equal to $(g_{m1}*g_{m2}* \ldots *g_{mn})$ RFin', can be effectively stabilized.

Figure 7:
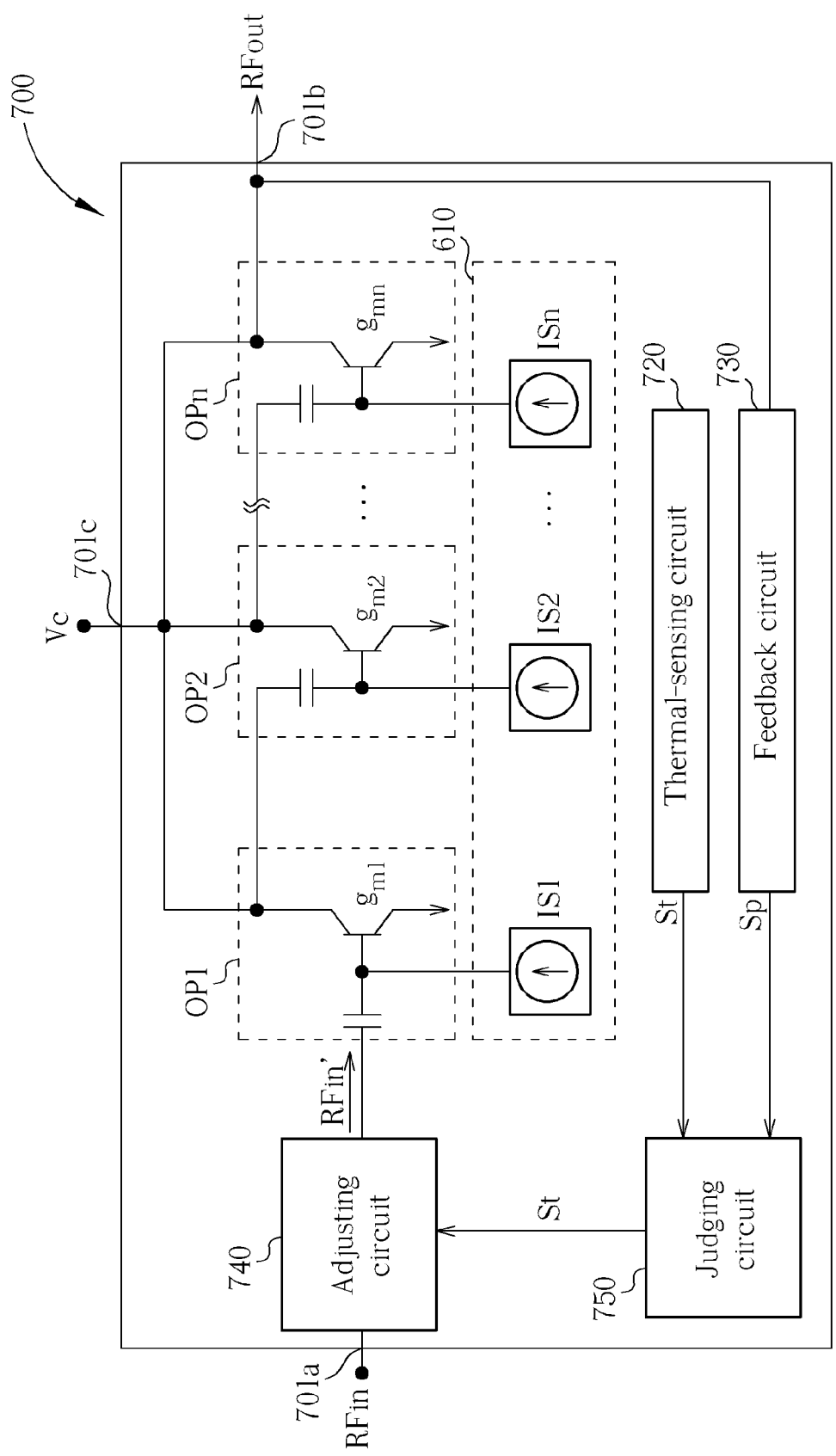
FIG. 7 is a functional diagram illustrating a power amplifier integrated circuit according to a fourth embodiment of the present invention.

Reference is made to FIG. 7 for a functional diagram illustrating a PAIC 700 according to a fourth embodiment of the present invention. The PAIC 700 includes a plurality of connecting ports 701a-701c, n stage amplifying units OP1-OPn, a bias circuit 710, a thermal-sensing circuit 720, a feedback circuit 730, an adjusting circuit 740, and a judging circuit 750. The input port 701a is for receiving an RF input signal RFin, the output port 701b is for providing an RF output signal RFout, and the supply voltage input port 701c is for receiving a constant bias voltage Vc. The bias circuit 710 includes n current sources for providing constant operational currents IS1-ISn to the n stage amplifying units OP1-OPn, respectively. The thermal-sensing circuit 720 can detect variations in the operational temperature, thereby generating a corresponding thermal sensing signal St. The feedback circuit 730 can detect power variations in the RF output signal RFout, thereby generating a corresponding power compensation signal Sp. The judging circuit 750 can receive the thermal sensing signal St from the thermal-sensing circuit 720 and the power compensation signal Sp from the feedback circuit 730, thereby generating a corresponding temperature/power compensation signal Stp to the adjusting circuit 740. The temperature/power compensation signal Stp reflects the influence on the signal gain caused by the operational temperature and the output power. The adjusting circuit 740 is coupled to the input port 701a for receiving the RF input signal RFin, adjusting the RF input signal RFin according to the temperature/power compensation signal Stp, and outputting a corresponding RF input signal RFin'. Each of the n amplifying units OP1-OPn includes a BJT having a collector coupled to the voltage input port 701c for receiving the constant bias voltage Vc and a base coupled to the bias circuit 710 for respectively receiving the operational currents IS1-ISn. The base of the BJT in the amplifying unit OP1 is coupled to the input port 701a via a capacitor, and the base of each BJT in the amplifying units OP2-OPn is coupled to the collector of the BJT in the corresponding prior-stage amplifying unit via a capacitor. The signal gains provided by the amplifying units OP1-OPn are represented by $g_{m1}$-$g_{mn}$, respectively. In the PAIC 700 of the present invention, the variations in the operational temperature can be detected by the thermal-sensing circuit 720, the power variations in the RF output signal RFout can be detected by the feedback circuit 730, both of which are then integrated by the judging circuit 750. The RF input signal RFin can thus be adjusted for simultaneously compensating temperature and power fluctuations without changing the signal gains $g_{m1}$-$g_{mn}$ of the amplifying units OP1-OPn. As a result, the output power of the RF output signal RFout provide by the PAIC 700, which is equal to $(g_{m1}*g_{m2}* \ldots *g_{mn})$ RFin', can be effectively stabilized.

Figure 8:
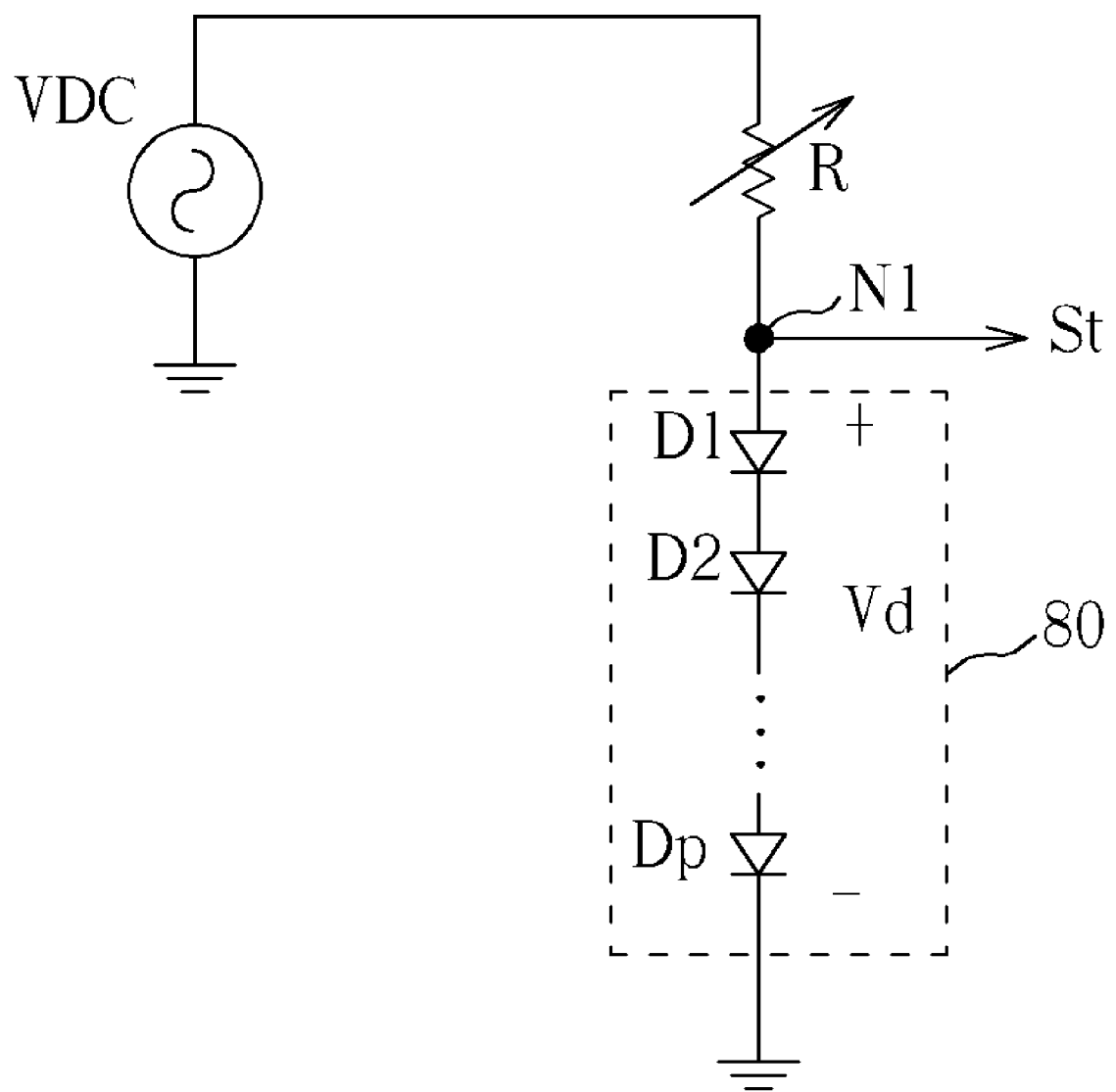
FIG. 8 is a diagram illustrating a thermal-sensing circuit according to the present invention.

Reference is made to FIG. 8 for a diagram illustrating the thermal-sensing circuit 420, 620 or 720 according to the first, third or fourth embodiment of the present invention. The thermal-sensing circuit depicted in FIG. 8, including a voltage source VDC, a variable resistor R, and a diode set 80, can output the thermal sensing signal St at a node N1. The diode set 80 includes p diodes D1-Dp coupled in series. The voltage established across the diode set 80 is represented by Vd. Therefore, the thermal sensing signal St can be represented as follows:

$$St=(VDC-Vd)/R$$

Figure 9A:
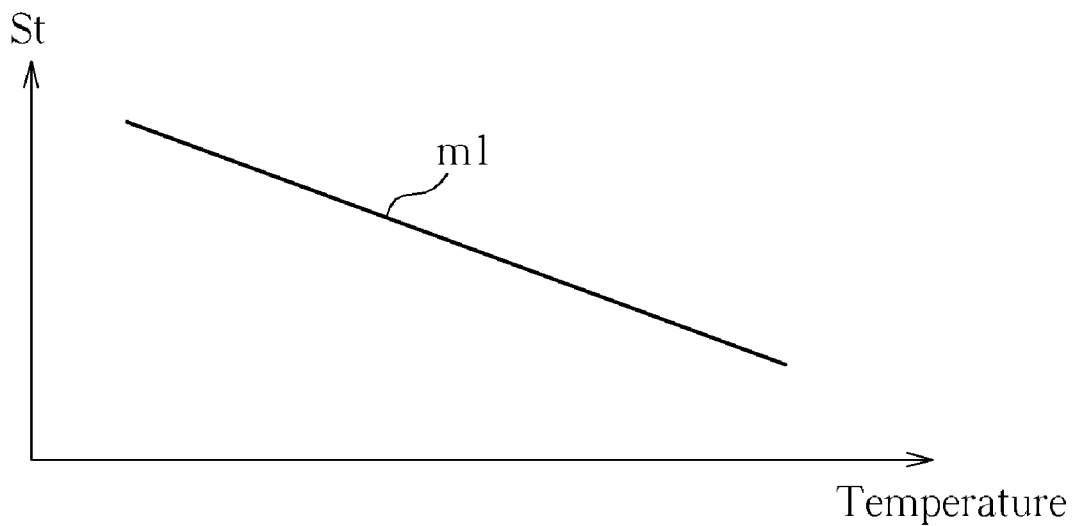
FIGS. 9a and 9b are diagrams illustrating the characteristic curves of the thermal sensing signal according to the present invention.
Figure 9B:
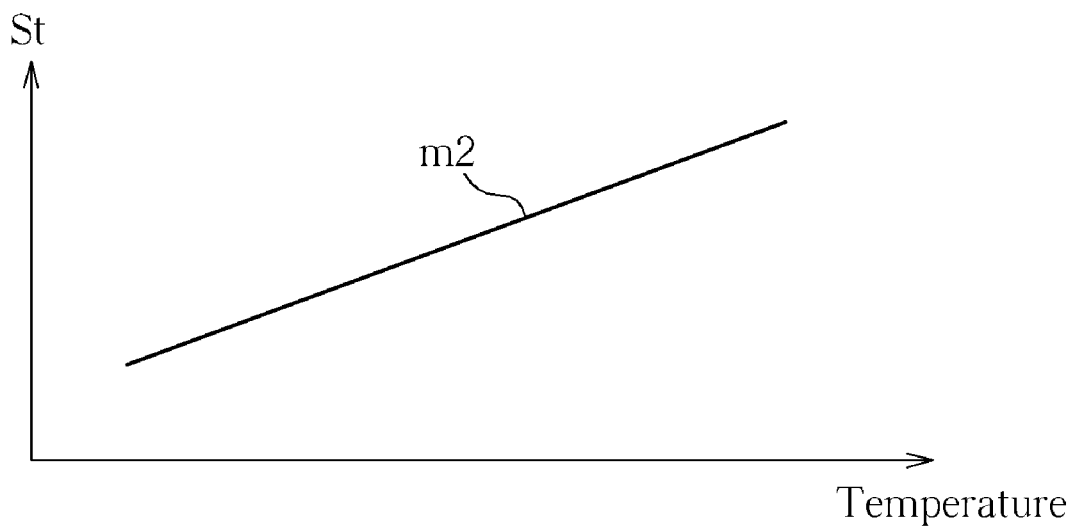

Since the characteristics of the diodes D1-Dp vary according to the operational temperature, the voltage Vd is negatively correlated to the operational temperature. By properly selecting the value of the variable resistor R and the number p of the diodes, the thermal sensing signal St can be represented by a curve with a negative slop m1, as shown in FIG. 9a. After signal inversion, a thermal sensing signal St' represented by a curve with a positive slop m2 (m2=−m1) can be obtained, as shown in FIG. 9b. The slops m1 and m2 both reflect how variations in the operational temperature influence the output power of the PAIC.

Figure 10A:
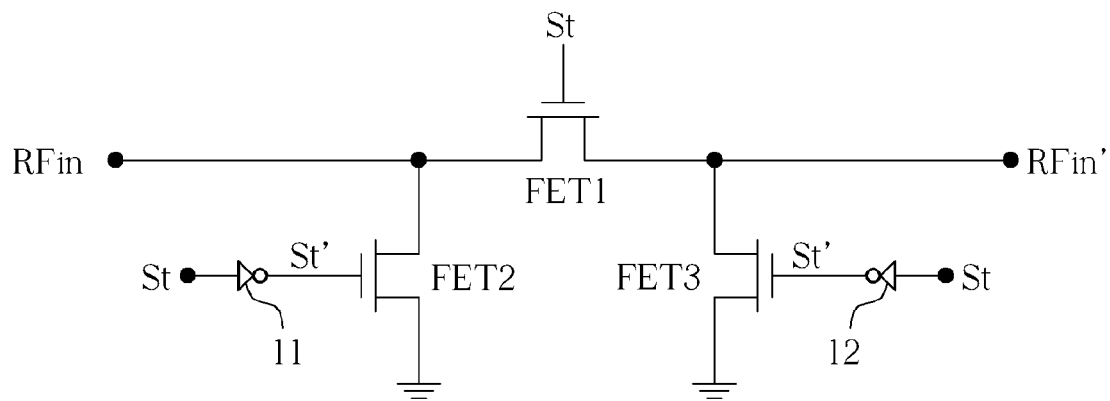
FIGS. 10a and 10b are diagrams illustrating the adjusting circuits according to first to fourth embodiments of the present invention.
Figure 10B:
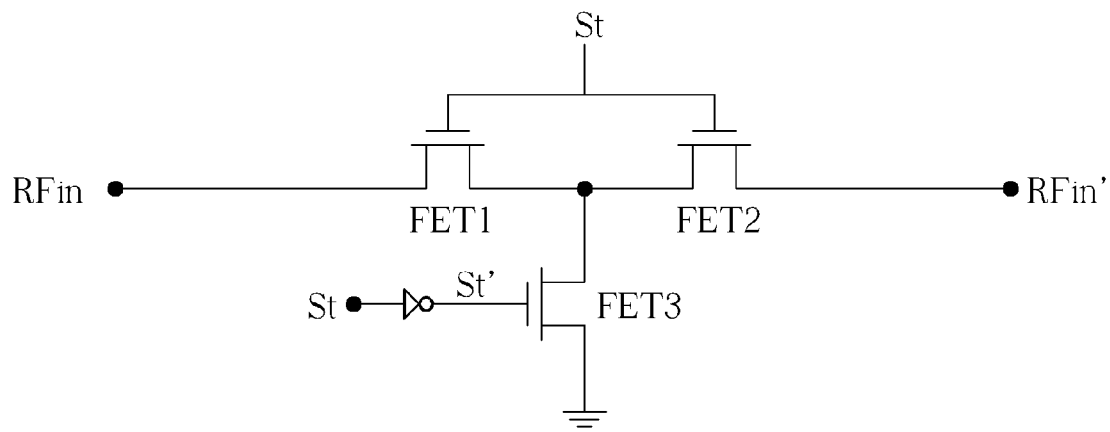

References are made to FIGS. 10a and 10b for diagrams illustrating the adjusting circuit 440, 540, 640 or 740 according to the first to fourth embodiments of the present invention. The adjusting circuit depicted in FIG. 10a adopts a π-network field effect transistor (FET) structure and includes FET switches FET1-FET3 and inverters 11-12. The FET switch FET1 can receive the thermal sensing signal St at it gate, while the FET switches FET2 and FET3 can receive the thermal sensing signal St' at their gates (by receiving the thermal sensing signal St respectively via the inverters 11 and 12). The adjusting circuit depicted in FIG. 10b adopts a T-network FET structure and includes FET switches FET1-FET3 and an inverter 11. The FET switches FET1 and FET2 can receive the thermal sensing signal St at their gates, while the FET switch FET3 can receive the thermal sensing signal St' at its gate (by receiving the thermal sensing signal St via the inverter 11). Therefore, the adjusting circuit according to the present invention can attenuate the RF input signal RFin according to the thermal sensing signal St, and can then output the attenuated RF input signal RFin' in order to provide thermal compensation.

In the previous embodiments of the present invention, BJTs are used as the amplifying units OP1-OPn. However, the present invention can also adopt other devices with similar function, such as FETs. The bias circuit of the present invention can provide a constant operational current or a constant operational voltage. The embodiments depicted in FIGS. 8, 9a, 9b, 10a and 10b are for explanatory purposes and do not limit the scope of the present invention. In the present PAIC, the RF input signal RFin can be adjusted for compensating temperature or power fluctuations without changing the signal gains $g_{m1}$-$g_{mn}$ of the amplifying units OP1-OPn. As a result, the power of the RF output signal RFout can be effectively stabilized.

Those skilled in the art will readily observe that numerous modifications and alterations of the device and method may be made while retaining the teachings of the invention.

What is claimed is:

1. A power amplifier integrated circuit (PAIC) with compensation mechanism for temperature, comprising:
    an input port for receiving a radio frequency (RF) input signal;
    an output port for providing an RF output signal, the RF output signal being an amplified version of the RF input signal;
    a thermal compensation circuit comprising:
        a thermal-sensing circuit for generating a thermal sensing signal according to the temperature; and
        a π-network FET attenuator for adjusting a level of the RF input signal according to the thermal sensing signal, thereby generating a corresponding 1st stage RF signal; and
    an amplifying circuit coupled to the thermal compensation circuit for receiving and amplifying the adjusted RF input signal.

2. The PAIC of claim 1, wherein the thermal-sensing circuit comprises:
    an output end for outputting the thermal sensing signal;
    a voltage source;
    a resistor coupled between the voltage source and the output end; and
    a diode coupled to the output end.

3. The PAIC of claim 1, wherein the thermal-sensing circuit comprises:
    an output end for outputting the thermal sensing signal;
    a voltage source;
    a resistor coupled between the voltage source and the output end; and
    a plurality of series-connected diode coupled to the output end.

4. The PAIC of claim 1, wherein the amplifying circuit comprises n stage amplifying units coupled in series for generating 2nd to (n+1)th stage RF signals by respectively amplifying 1st to nth stage RF signals with 1st to nth signal gains, thereby outputting the (n+1)th stage RF signal as the RF output signal.

5. The PAIC of claim 4, wherein each of the n stage amplifying units includes a bipolar junction transistor (BJT) or a field effect transistor (FET).

6. The PAIC of claim 1, wherein the π-network FET attenuator comprises:
    a first FET comprising:
        a first end coupled to the input port of the PAIC;
        a second end for outputting the 1st stage RF signal; and
        a control end for receiving the thermal sensing signal;
    a second FET comprising:
        a first end coupled to the input port of the PAIC;
        a second end coupled to a ground; and
        a control end for receiving a reverse signal associated with the thermal sensing signal; and
    a third FET comprising:
        a first end coupled to the second end of the first FET;
        a second end coupled to the ground; and
        a control end for receiving the reverse signal.

7. A power amplifier integrated circuit (PAIC) with compensation mechanism for temperature, comprising:
    an input port for receiving a radio frequency (RF) input signal;
    an output port for providing an RF output signal, the RF output signal being an amplified version of the RF input signal;
    a thermal compensation circuit comprising:
        a thermal-sensing circuit for generating a thermal sensing signal according to the temperature; and
        a T-network FET attenuator for adjusting a level of the RF input signal according to the thermal sensing signal, thereby generating a corresponding 1st stage RF signal; and
    an amplifying circuit coupled to the thermal compensation circuit for receiving and amplifying the adjusted RF input signal.

8. The PAIC of claim 7, wherein the T-network FET attenuator comprises:
    a first FET comprising:
        a first end coupled to the input port of the PAIC;
        a second end; and
        a control end for receiving the thermal sensing signal;
    a second FET comprising:
        a first end coupled to the second end of the first FET;
        a second end for outputting the 1st stage RF signal; and
        a control end coupled to the control end of the first FET; and
    a third FET comprising:
        a first end coupled to the second end of the first FET;
        a second end coupled to a ground; and
        a control end for receiving a reverse signal associated with the thermal sensing signal.

9. A power amplifier integrated circuit (PAIC) with compensation mechanism for power, comprising:
    an input port for receiving an RF input signal;
    an output port for outputting an RF output signal, the RF output signal being an amplified version of the RF input signal;
    a feedback circuit for detecting voltage variations in the RF output signal, thereby generating a corresponding power compensation signal;
    a π-network FET attenuator for adjusting a level of the RF input signal according to the power compensation signal, thereby generating a corresponding 1st stage RF signal; and
    an amplifying circuit for generating the RF output signal by amplifying the 1st stage RF signal.

10. The PAIC of claim 9, wherein the amplifying circuit comprises n stage amplifying units coupled in series for generating 2nd to (n+1)th stage RF signals by respectively amplifying 1st to nth stage RF signals with 1st to nth signal gains, thereby outputting the (n+1)th stage RF signal as the RF output signal.

11. The PAIC of claim 10, wherein each of the n stage amplifying units includes a BJT or an FET.

12. The PAIC of claim 9, wherein the π-network FET attenuator comprises:
    a first FET comprising:
        a first end coupled to the input port of the PAIC;
        a second end for outputting the 1st stage RF signal; and
        a control end for receiving the power compensation signal;

a second FET comprising:
  a first end coupled to the input port of the PAIC;
  a second end coupled to a ground; and
  a control end for receiving a reverse signal associated with the power compensation signal; and
a third FET comprising:
  a first end coupled to the second end of the first FET;
  a second end coupled to the ground; and
  a control end for receiving the reverse signal.

13. A power amplifier integrated circuit (PAIC) with compensation mechanism for power, comprising:
an input port for receiving an RF input signal;
an output port for outputting an RF output signal, the RF output signal being an amplified version of the RF input signal;
a feedback circuit for detecting voltage variations in the RF output signal, thereby generating a corresponding power compensation signal;
a T-network FET attenuator for adjusting a level of the RF input signal according to the power compensation signal, thereby generating a corresponding 1st stage RF signal; and
an amplifying circuit for generating the RF output signal by amplifying the 1st stage RF signal.

14. The PAIC of claim 13, wherein the T-network FET attenuator comprises:
a first FET comprising:
  a first end coupled to the input port of the PAIC;
  a second end; and
  a control end for receiving the power compensation signal;
a second FET comprising:
  a first end coupled to the second end of the first FET;
  a second end for outputting the 1st stage RF signal; and
  a control end coupled to the control end of the first FET; and
a third FET comprising:
  a first end coupled to the second end of the first FET;
  a second end coupled to a ground; and
  a control end for receiving a reverse signal associated with the power compensation signal.

15. A power amplifier integrated circuit (PAIC) with compensation mechanism for temperature and power comprising:
an input port for receiving an RF input signal;
an output port for outputting an RF output signal, the RF output signal being an amplified version of the RF input signal;
a thermal-sensing circuit for generating a thermal sensing signal according to an operational temperature;
a feedback circuit for detecting voltage variations in the RF output signal, thereby generating a corresponding power compensation signal;
a logic judging circuit for outputting a compensation signal according to the thermal sensing signal and the power compensation signal;
a π-network FET attenuator for adjusting a level of the RF input signal according to the compensation signal, thereby generating a corresponding 1st stage RF signal; and
an amplifying circuit for generating the RF output signal by amplifying the 1st stage RF signal.

16. The PAIC of claim 15, wherein the logic judging circuit outputs the thermal sensing signal or the power compensation signal as the compensation signal.

17. The PAIC of claim 15, wherein the logic judging circuit outputs the compensation signal which is simultaneously associated with the thermal sensing signal and the power compensation signal.

18. The PAIC of claim 15, wherein the thermal-sensing circuit comprises:
an output end for outputting the thermal sensing signal;
a voltage source;
a resistor coupled between the voltage source and the output end; and
a diode coupled to the output end.

19. The PAIC of claim 15, wherein the thermal-sensing circuit comprises:
an output end for outputting the thermal sensing signal;
a voltage source;
a resistor coupled between the voltage source and the output end; and
a plurality of series-connected diode coupled to the output end.

20. The PAIC of claim 15, wherein the amplifying circuit comprises n stage amplifying units coupled in series for generating 2nd to (n+1)th stage RF signals by respectively amplifying 1st to nth stage RF signals with 1st to nth signal gains, thereby outputting the (n+1)th stage RF signal as the RF output signal.

21. The PAIC of claim 20, wherein each of the n stage amplifying units includes a BJT or an FET.

22. The PAIC of claim 15, wherein the π-network FET attenuator comprises:
a first FET comprising:
  a first end coupled to the input port of the PAIC;
  a second end for outputting the 1st stage RF signal; and
  a control end for receiving the thermal sensing signal;
a second FET comprising:
  a first end coupled to the input port of the PAIC;
  a second end coupled to a ground; and
  a control end for receiving a reverse signal associated with the thermal sensing signal; and
a third FET comprising:
  a first end coupled to the second end of the first FET;
  a second end coupled to the ground; and
  a control end for receiving the reverse signal.

23. A power amplifier integrated circuit (PAIC) with compensation mechanism for temperature and power comprising:
an input port for receiving an RF input signal;
an output port for outputting an RF output signal, the RF output signal being an amplified version of the RF input signal;
a thermal-sensing circuit for generating a thermal sensing signal according to an operational temperature;
a feedback circuit for detecting voltage variations in the RF output signal, thereby generating a corresponding power compensation signal;
a logic judging circuit for outputting a compensation signal according to the thermal sensing signal and the power compensation signal;
a T-network FET attenuator for adjusting a level of the RF input signal according to the compensation signal, thereby generating a corresponding 1st stage RF signal; and
an amplifying circuit for generating the RF output signal by amplifying the 1st stage RF signal.

24. The PAIC of claim 23, wherein the T-network FET attenuator comprises:
a first FET comprising:
  a first end coupled to the input port of the PAIC;
  a second end; and a control end for receiving the thermal sensing signal;
a second FET comprising:
- a first end coupled to the second end of the first FET;
- a second end for outputting the 1st stage RF signal; and
- a control end coupled to the control end of the first FET; and a third FET comprising:
- a first end coupled to the second end of the first FET;
- a second end coupled to a ground; and
- a control end for receiving a reverse signal associated with the thermal sensing signal.

* * * * *